(12) United States Patent
Miki

(10) Patent No.: US 7,888,687 B2
(45) Date of Patent: Feb. 15, 2011

(54) ELECTRODE FOR SEMICONDUCTOR LIGHT EMITTING DEVICE

(75) Inventor: Hisayuki Miki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 134 days.

(21) Appl. No.: 12/066,194

(22) PCT Filed: Sep. 6, 2006

(86) PCT No.: PCT/JP2006/318088

§ 371 (c)(1),
(2), (4) Date: Mar. 7, 2008

(87) PCT Pub. No.: WO2007/029859

PCT Pub. Date: Mar. 15, 2007

(65) Prior Publication Data

US 2009/0294791 A1    Dec. 3, 2009

Related U.S. Application Data

(60) Provisional application No. 60/717,182, filed on Sep. 16, 2005.

(30) Foreign Application Priority Data

Sep. 8, 2005   (JP) .............................. 2005-260146

(51) Int. Cl.
*H01L 27/15*   (2006.01)
*H01L 21/00*   (2006.01)

(52) U.S. Cl. .............................. 257/79; 257/80; 257/90; 257/94; 257/E51.019; 257/E33.001; 257/E31.099; 257/E25.028; 438/22; 438/24; 438/29; 438/46; 438/47

(58) Field of Classification Search ................... 257/79, 257/80, 90, 94, E51.019, E33.001, E31.099, 257/E25.028; 438/22, 24, 29, 30, 46, 47
See application file for complete search history.

(56) References Cited

U.S. PATENT DOCUMENTS

| 6,281,524 | B1 * | 8/2001 | Yamamoto et al. ............. 257/99 |
| 6,380,564 | B1 | 4/2002 | Chen et al. |
| 6,469,323 | B1 * | 10/2002 | Nakamura et al. ............. 257/94 |
| 6,711,191 | B1 * | 3/2004 | Kozaki et al. ............. 372/43.01 |
| 6,969,873 | B2 | 11/2005 | Hata et al. |
| 7,423,712 | B2 * | 9/2008 | Jeoung et al. ............... 349/114 |
| 2001/0042860 | A1 | 11/2001 | Hata et al. |
| 2005/0211989 | A1 * | 9/2005 | Horio et al. .................... 257/79 |

FOREIGN PATENT DOCUMENTS

JP    9-232632 A    9/1997

(Continued)

*Primary Examiner*—Hsien-ming Lee
(74) *Attorney, Agent, or Firm*—Sughrue Mion, PLLC

(57) ABSTRACT

An object of the present invention is to provide an electrode that can produce powerful light emission with low driving voltage, without reducing crystallinity. The electrode for a semiconductor light emitting device has a structure with an n-type or p-type electrode and an opposing p-type or n-type electrode on the same side of the light emitting device. Both electrodes comprise a bonding pad and a transparent conductive layer. Preferably, the light emitting device is a GaN-based semiconductor light emitting device. The material of the transparent conductive layer is a metal oxide such as ITO, or a metal such as Al, Ni.

21 Claims, 2 Drawing Sheets

FOREIGN PATENT DOCUMENTS

| | | |
|---|---|---|
| JP | 2001-217456 A | 8/2001 |
| JP | 2003-133590 A | 5/2003 |
| JP | 2004-228401 A | 8/2004 |
| JP | 2005-39264 A | 2/2005 |
| JP | 2005-191459 A | 7/2005 |

* cited by examiner

ELECTRODE FOR SEMICONDUCTOR LIGHT EMITTING DEVICE

CROSS-REFERENCES TO RELATED APPLICATIONS

This application claims benefit of Provisional Application Ser. No. 60/717,182 filed Sep. 16, 2005, incorporated herein by reference, under 35 U.S.C. 111(b) pursuant to 35 U.S.C. 119(e)(1).

TECHNICAL FIELD

The present invention relates to an electrode for a semiconductor light emitting device, and particularly to an electrode for a semiconductor light emitting device that can exhibit low driving voltage and powerful light emission, which is suitable as a gallium nitride-based compound semiconductor light emitting device.

BACKGROUND ART

In recent years, GaN-based compound semiconductor materials have become notable as semiconductor materials for short-wavelength light emitting devices. GaN-based compound semiconductors are formed by Metal Organic Chemical Vapor Deposition (MOCVD) or Molecular Beam Epitaxy (MBE), using various oxides such as sapphire single crystals or Group III-V compounds as substrates.

The properties of GaN-based compound semiconductor materials include low current diffusion in the transverse direction. This is attributed to dislocations threading from the substrate to the surface, which are abundant in epitaxial crystals, but the details thereof are not fully understood. In p-type GaN-based compound semiconductors, the resistivity is higher than the resistivity in n-type GaN-based compound semiconductors, and with mere lamination of a metal on a portion of the surface there is essentially no transverse spread of current in the p-layer, and light emission only occurs directly under the positive electrode in an LED structure having a pn junction.

Thus, it is common to employ a light-permeable positive electrode wherein light emitted directly under the positive electrode is extracted outward through the positive electrode. A common technique used commercially for a positive electrode is to laminate Ni and Au to about a few tens of nanometers each on the p-layer, and then heat the laminate in an oxygen atmosphere for alloying treatment (see Japanese Patent No. 2803742). Conductive transparent oxides such as ITO are also employed. A conductive transparent oxide can be formed into a film by sputtering or vapor deposition.

However, the problem of current diffusion still has not been completely solved using such transparent electrodes. One reason for this is insufficient current diffusion within the n-layer. In order to increase current diffusion in the n-layer it is necessary either to lower the resistivity of the n-layer or increase the film thickness to lower the resistance value. However, such strategies for lowering the resistance value also reduce the crystallinity. Reduced crystallinity tends to result in impaired characteristics such as aging-induced leaking and lower electrostatic resistance.

There have been proposed methods of reducing the distance between the n-electrode and p-electrode by surrounding the transparent electrode situated at the center with the other electrode (see Japanese Unexamined Patent Publication Nos. 9-97922 and 8-340131). Still, in such a structure with the transparent electrode at the center surrounded with the n-electrode, emitted light is blocked by the surrounding electrode and fails to be satisfactorily extracted outward.

As the electrode positioning used for chips with relatively large areas, there are disclosed techniques for forming structures in which the negative electrode and positive electrode are alternately embedded in a comb-like fashion (see Japanese Unexamined Patent Publication Nos. 5-335622 and 2003-133589). However, when such a configuration is used in a semiconductor that exhibits the aforementioned problem of current spread in the transverse direction of the p-layer and n-layer, emitted light is still blocked by the electrode and fails to be satisfactorily extracted outward.

DISCLOSURE OF INVENTION

It is an object of the present invention solve the problems referred to above by providing an electrode that can produce powerful light emission with low driving voltage, without reducing crystallinity.

The term "light-permeable" according to the invention means light-permeable for light in the light emitting wavelength region. In the case of a gallium nitride-based compound semiconductor light emitting device, the light emitting wavelength region is generally in the range of 300-700 nm.

The present invention has been accomplished in order to achieve the aforestated object, and it comprises the following inventions.

(1) An electrode for a semiconductor light emitting device, which is an electrode for a semiconductor light emitting device having a structure with an n-type or p-type electrode and an opposing p-type or n-type electrode on the same side of the light emitting device, characterized in that both electrodes comprise a bonding pad and a transparent conductive layer.

(2) An electrode for a semiconductor light emitting device, which is an electrode for a semiconductor light emitting device having a structure with an n-type or p-type electrode and an opposing p-type or n-type electrode on the same side of the light emitting device, characterized in that both electrodes have the bonding pad formed on the transparent conductive layer.

(3) An electrode for a semiconductor light emitting device according to (1) or (2) above, characterized by having a flat shape wherein the transparent conductive layer of one electrode is situated in the center region of the light emitting device and the transparent conductive layer of the opposing electrode surrounds all or a portion of the perimeter of the transparent conductive layer of the first electrode.

(4) An electrode for a semiconductor light emitting device according to (1) or (2) above, characterized by having a flat shape in which the transparent conductive layer of one electrode and the transparent conductive layer of the other electrode are alternately embedded.

(5) An electrode for a semiconductor light emitting device according to any one of (1) to (4) above, characterized in that the area of the transparent conductive layer of the n-type electrode is smaller than the area of the transparent conductive layer of the p-type electrode.

(6) An electrode for a semiconductor light emitting device according to any one of (1) to (5) above, characterized in that the material of the transparent conductive layer of the n-type electrode is at least one selected from the group consisting of ITO, aluminum oxide, zinc, fluorine-doped tin oxide, titanium oxide, zinc sulfide, bismuth oxide and magnesium oxide.

(7) An electrode for a semiconductor light emitting device according to (6) above, characterized in that the thickness of the transparent conductive layer of the n-type electrode is 10-100 nm.

(8) An electrode for a semiconductor light emitting device according to any one of (1) to (5) above, characterized in that the material of the transparent conductive layer of the n-type electrode is at least one selected from the group consisting of aluminum, nickel, titanium, gold, silver and chromium.

(9) An electrode for a semiconductor light emitting device according to (8) above, characterized in that the thickness of the transparent conductive layer of the n-type electrode is 1-100 nm.

(10) An electrode for a semiconductor light emitting device according to any one of (1) to (9) above, characterized in that the transparent conductive layer of the n-type electrode transmits at least 70% of the emitted light.

(11) An electrode for a semiconductor light emitting device according to any one of (1) to (10) above, characterized in that the area of the transparent conductive layer of the n-type electrode is 5-50% of the light emitting device chip area.

(12) An electrode for a semiconductor light emitting device according to any one of (1) to (11) above, characterized in that the n-type electrode is constructed of a bonding pad and a transparent conductive layer that extends from the pad along the perimeter of the light emitting device chip.

(13) An electrode for a semiconductor light emitting device according to (1) to (12) above, characterized in that the thickness of the transparent conductive layer of the p-type electrode is 5-1000 nm.

(14) An electrode for a semiconductor light emitting device according to any one of (1) to (13) above, characterized in that the bonding pads of the n-type electrode and p-type electrode are formed opposite the sides or corners of the light emitting device.

(15) An electrode for a semiconductor light emitting device according to any one of (1) to (14) above, characterized in that the bonding pads have a multilayer structure, of which the lowermost layer (the side in contact with the transparent conductive layer) is a metal selected from the group consisting of Cr, Al, Ti, a platinum family metal such as Pt, Rh, Ru or Ir, or Ag.

(16) An electrode for a semiconductor light emitting device according to any one of (1) to (15) above, characterized in that the bonding pads have a multilayer structure, and the layer above the lowermost layer is a metal selected from the group consisting of Ti, Cr and Al.

(17) An electrode for a semiconductor light emitting device according to any one of (1) to (16) above, characterized in that the bonding pads have a multilayer structure, and the uppermost layer is Au or Al.

(18) An electrode for a semiconductor light emitting device according to any one of (1) to (17) above, characterized in that the light emitting device chip has a size of 500 µm or greater.

(19) An electrode for a semiconductor light emitting device according to any one of (1) to (18) above, characterized in that the light emitting device is a GaN-based semiconductor light emitting device.

(20) A light emitting device employing an electrode according to any one of (1) to (19) above.

(21) A light emitting device obtained by combining a light emitting device according to (20) above with a fluorescent material.

(22) A lamp employing a light emitting device according to (20) or (21) above.

Figure 1:
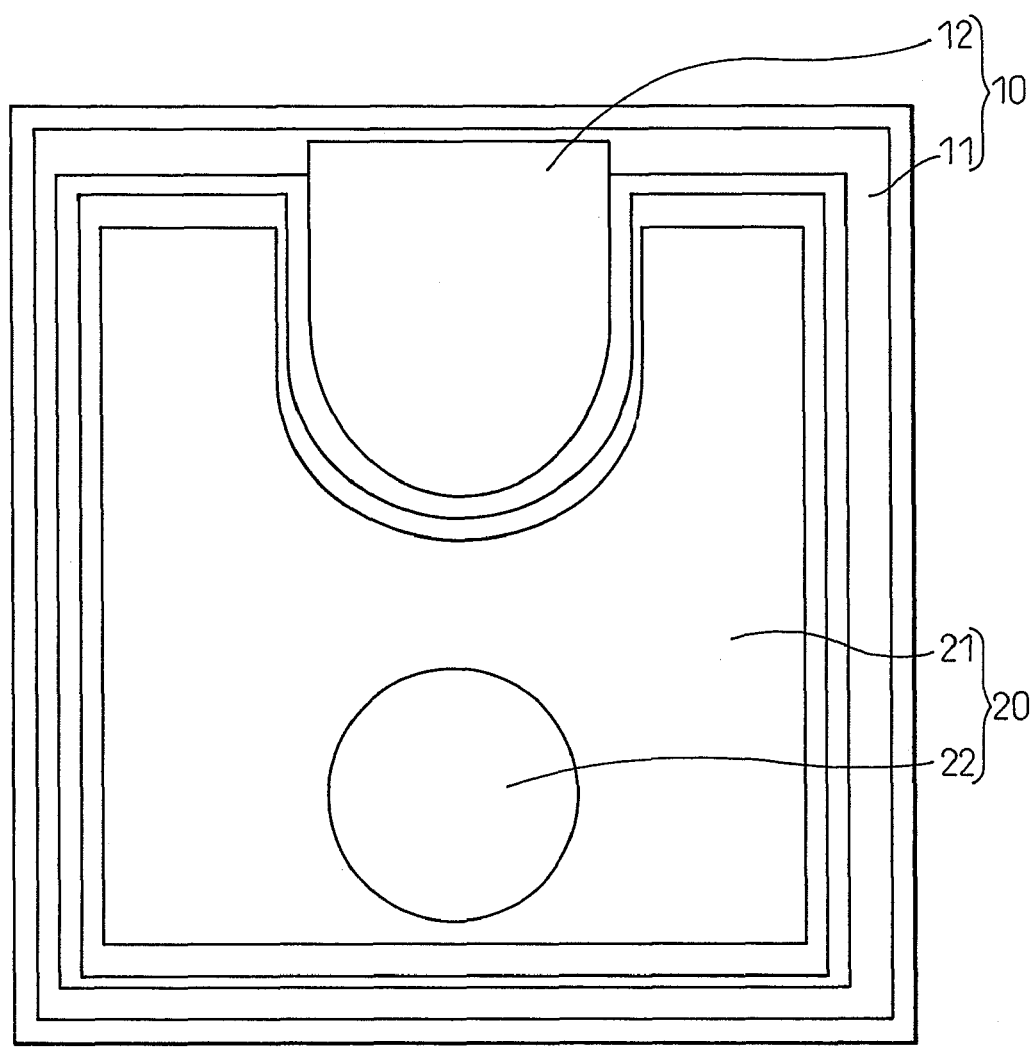
FIG. 1 is a schematic cross-sectional view of a gallium nitride-based compound semiconductor light emitting device having a positive electrode according to the invention, as fabricated in Example 1.

10 Positive electrode
11 Transparent conductive layer
12 Bonding pad
20 Negative electrode
21 Transparent conductive layer
22 Bonding pad

BEST MODE FOR CARRYING OUT THE INVENTION

The present invention will now be explained in detail with reference to the accompanying drawings.

The terms "light-permeable" and "transparent" according to the invention mean permeable and transparent for light in the light emitting wavelength region. In the case of a gallium nitride-based compound semiconductor light emitting device, the light emitting wavelength region is generally in the range of 300-700 nm. The "transmittance" of light is also transmittance for light at these wavelengths.

FIG. 1 is a schematic plan view of an embodiment of a light emitting device with an electrode configuration according to the invention. Here, 10 is an n-type electrode (negative electrode), which is composed of a negative electrode transparent conductive layer (11) and bonding pad (12). The numeral 20 is a p-type electrode (positive electrode), which is composed of a positive electrode transparent conductive layer (21) and bonding pad (22). The negative electrode is formed on the exposed n-type semiconductor after etching the semiconductor layer from the top until the n-type semiconductor layer is exposed. A portion of the negative electrode bonding pad is formed on the transparent conductive layer 11 while the remainder is formed on the n-type semiconductor layer. The bonding pad does not need to be on the n-type semiconductor layer. The positive bonding pad is formed with a portion thereof superposed on the transparent conductive layer.

Figure 2:
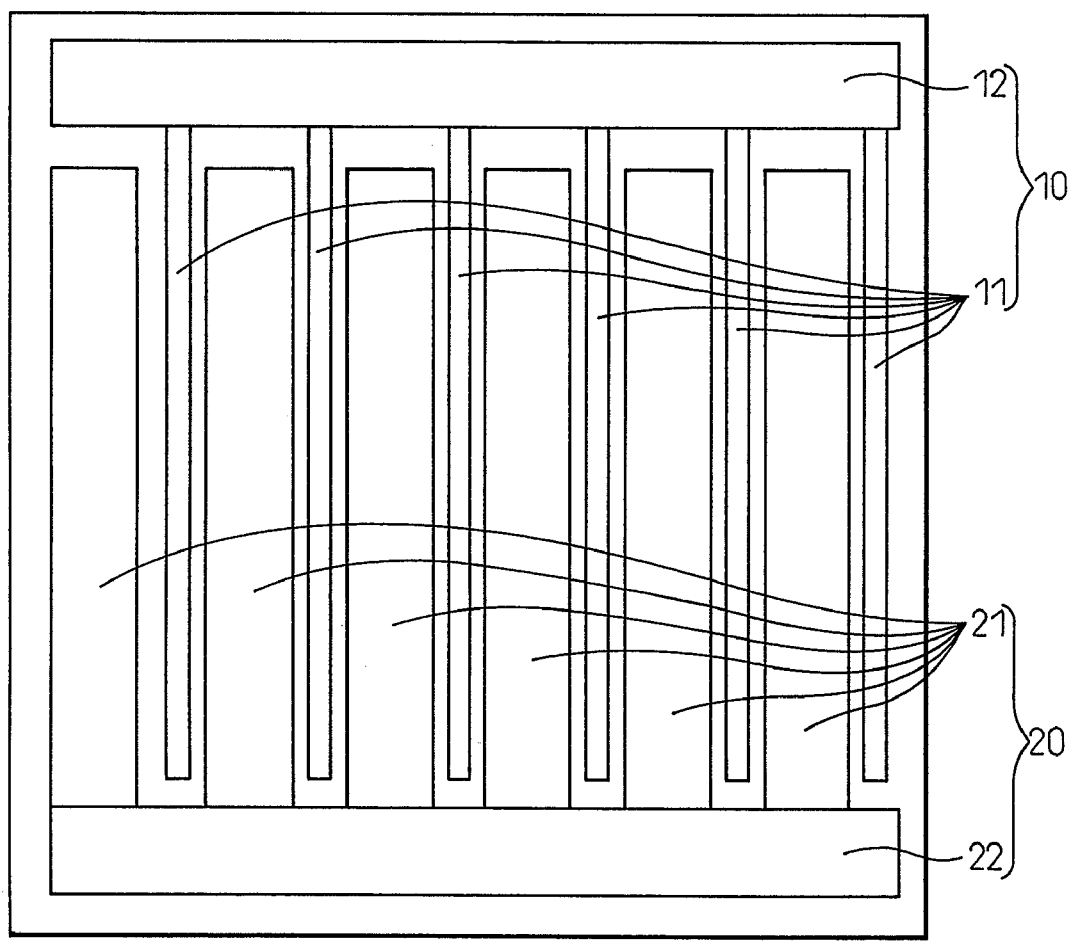
FIG. 2 is a schematic plan view of a gallium nitride-based compound semiconductor light emitting device having a positive electrode according to the invention, as fabricated in Example 2.

FIG. 2 is a schematic plan view of another embodiment of a light emitting device with an electrode configuration according to the invention. The numerals in this drawing are the same as in FIG. 1.

When using an electrode of the invention wherein the conductive layers composing both the n-type electrode (also referred to as n-electrode) and p-type electrode (also referred to as p-electrode) are transparent, it is possible to increase the area of each transparent conductive layer without reducing the light extraction. This allows the contact area between the transparent conductive layer and semiconductor layer to be increased for a lower driving voltage, while also allowing a closer configuration between the p-electrode transparent conductive layer and n-electrode transparent conductive layer, and the reduced current spread can avoid the problem of reduced light emitting area.

The transparent conductive layers of the electrode of the invention may be configured so that one (the p-type layer in FIG. 1) is situated at the center of the device, while the other (the n-type layer in FIG. 1) surrounds its perimeter. In this case, the other transparent conductive layer does not necessarily have to completely surround the first transparent conductive layer, and it is sufficient if it surrounds at least half the lengths of two sides. However, a configuration with complete surrounding is of course most effective against the problem of current diffusion. It also provides an effect of increasing the transparent conductive layer area of the n-electrode.

The bonding pads may be situated anywhere on the transparent conductive layers, but preferably they are situated as far apart as possible, such as on opposite corners or sides.

Since the p-type layer is usually associated with the problem of poor current spread, it is preferred for the area of the transparent conductive layer of the p-electrode to be larger than the area of the transparent conductive layer of the n-electrode. The effect will be greater if the transparent conductive layer situated at the center is the one for the p-electrode.

The transparent conductive layers of the electrode of the invention may have a comb-like or lattice-like configuration as shown in FIG. 2, where one and the other are alternately embedded. For the reasons explained above, it is preferred for the area of the transparent conductive layer of the p-electrode to be larger than the area of the transparent conductive layer of the n-electrode, even with a comb-like configuration.

This configuration is suitable for "giant" light emitting device chips with sides of 500 μm or greater. The bonding pads may be situated anywhere on the electrodes, but preferably they are situated as far apart as possible, such as on opposite corners or sides.

A wide variety of materials are known for positive electrode transparent conductive layers, and any of them may be used. As one example, there may be mentioned a metal layered structure such as a bilayer structure of Au and NiO or a bilayer structure of Pt and Au from the semiconductor side, or a conductive oxide such as ITO may be used.

The material used for the negative electrode transparent conductive layer may also be a metal thin-film or conductive oxide. For example, there may be used thin-films of ITO, zinc aluminum oxide, fluorine-doped tin oxide, titanium oxide, zinc sulfide, bismuth oxide or magnesium oxide, or of aluminum, nickel, titanium, gold, silver, chromium or the like.

These negative electrode transparent conductive layers preferably have a light transmittance of 70% or greater.

Thus, when a metal thin-film is used the film thickness must be exceedingly small. The film thickness is preferably 1-100 nm. At less than 1 nm, the current diffusion effect will not be satisfactorily exhibited. If it is greater than 100 nm, the reduction in light transmission will be notable and may lead to a reduction in light emission output. The thickness is more preferably 1-50 nm. A thickness in the range of 3-20 nm will produce an optimal balance between light transmission and current diffusion effect, for uniform and high-output light emission.

When a conductive oxide is used, the thickness is preferably between 10 nm and 100 μm. At less than 10 nm, no current spread will be obtained in the transverse direction in the transparent electrode. At greater than 100 μm, the reduction in light transmission will be notable and may lead to a reduction in light emission output. The thickness is more preferably 50 nm-1 μm. The light transmittance in this case is also preferably 70% or greater.

The area of the negative electrode transparent conductive layer is preferably between 5% and 50% of the area of the light emitting device chip (the semiconductor layer of the light emitting device). As mentioned above, since current diffusion cannot be expected in the p-type layer, it is better to circulate current vertically within the p-type layer. Thus, in most cases the structure is one having light emission under the p-layer.

Consequently, if the area of the negative electrode transparent conductive layer is too large, the luminescent area is reduced. The limit is 50% of the light emitting device chip area. On the other hand, if the area is smaller than 50%, the contact area is reduced and the driving voltage increases.

The negative electrode bonding pad may be made of a known material and have a known structure. The negative electrode bonding pad usually has a multilayer structure, and the material of its lowermost layer is Cr, Al, Ti, a platinum family metal such as Pt, Rh, Ru or Ir, or Ag, or an alloy containing at least one of these metals. Of these, Cr, Al, Ag, Pt and alloys containing one or more of these metals are commonly used as materials for electrodes, while they are readily available and easy to handle.

The layer formed on the lowermost layer of the bonding pad electrode also serves to reinforce the strength of the bonding pad electrode as a whole. Thus, it is necessary to use a relatively strong metal material or to adequately increase the thickness of the film. Preferred materials are Ti, Cr and Al. Among these, Ti is preferred from the standpoint of material strength. A layer imparted with such function is referred to as a barrier layer.

The uppermost layer of the bonding pad electrode is preferably a material with satisfactory adhesive properties for bonding balls. Gold is usually used as the material for bonding balls, and Au and Al are known as metals with satisfactory adhesion for gold balls. Gold is especially preferred of these two. The thickness of the uppermost layer is preferably 50-1000 nm and more preferably 100-500 nm. If it is too thin adhesion with the bonding balls will be poor, while if it is too thick, no particular advantage will be achieved and cost will merely be increased.

The n-electrode bonding pad may have any desired shape. However, because the bonding pad is a non-transparent region, it preferably has as small an area as possible, and the area can be minimized if it is circular. In order to aid current diffusion, it is effective to match the shape of the exposed region of the n-layer that is created for formation of the n-electrode.

A smaller area of the n-electrode bonding pad is preferred because it will reduce the non-transparent region, but if it is too small it can hamper bonding. The preferred range is a diameter from about 50 μm to about 200 μm.

The methods for forming the p-electrode transparent region and bonding pad and the n-electrode transparent region and bonding pad are not particularly restricted, and a publicly known vacuum vapor deposition or sputtering method may be employed.

The positive electrode of the invention may be used without any restrictions in a semiconductor light emitting device comprising a gallium nitride-based compound semiconductor light emitting device known in the prior art, prepared by laminating a gallium nitride-based compound semiconductor on a substrate via a buffer layer and forming an n-type semiconductor layer, luminescent layer and p-type semiconductor layer.

The substrate material used for the substrate is not restricted in any way and may be, for example, an oxide single crystal such as sapphire single crystal ($Al_2O_3$; A-surface, C-surface, M-surface, R-surface) or spinel single crystal ($MgAl_2O_4$), ZnO single crystal, $LiAlO_2$ single crystal, $LiGaO_2$ single crystal or MgO single crystal, or a Si single crystal, SiC single crystal, GaAs single crystal, AlN single crystal, GaN single crystal or boride single crystal such as $ZrB_2$ single crystal. There are no particular restrictions on the plane direction of the substrate. It may be a just substrate or an off-angle substrate.

The n-type semiconductor layer, light emitting layer and p-type semiconductor layer used are not restricted in any way and include those with various known structures. In particular, the carrier concentration of the p-type semiconductor layer may be an ordinary concentration, but the light-permeable electrode of the invention can also be applied for p-type semiconductor layers with relatively low carrier concentrations of, for example, about $1 \times 10^{17}$ cm$^{-3}$.

The carrier concentration of the n-type semiconductor layer is preferably, for example, about $1 \times 10^{17}$ cm$^{-3}$ to $2 \times 10^{19}$ cm$^{-3}$. If the concentration is lower the contact resistance may be excessively increased, while if it is higher the crystallinity and flatness may tend to be reduced. The concentration is more preferably between $1 \times 10^{18}$ cm$^{-3}$ and $1 \times 10^{19}$ cm$^{-3}$, and optimally $5 \times 10^{18}$ cm$^{-3}$ and $8 \times 10^{18}$ cm$^{-3}$.

The gallium nitride-based compound semiconductors of the n-type semiconductor layer, light emitting layer and p-type semiconductor layer according to the invention may be semiconductors of various compositions represented by the general formula $Al_xIn_yGa_{1-x-y}N$ ($0 \leq x < 1$, $0 \leq y < 1$, $0 \leq x+y < 1$), with no restrictions whatsoever.

The process used to grow the gallium nitride-based compound semiconductors is not particularly restricted, and any processes known for growing Group III nitride semiconductors may be employed, such as MOCVD (Metal Organic Chemical Vapor Deposition), HVPE (Hydride Vapor Phase Epitaxy) or MBE (Molecular Beam Epitaxy). The preferred growth method from the standpoint of film thickness control and bulk productivity is MOCVD. MOCVD employs hydrogen ($H_2$) or nitrogen ($N_2$) as the carrier gas, trimethylgallium (TMG) or triethylgallium (TEG) as the source of Ga as the Group III element, trimethylaluminum (TMA) or triethylaluminum (TEA) as the Al source, trimethylindium (TMI) or triethylindium (TEI) as the In source and ammonia ($NH_3$) or hydrazine ($N_2H_4$) as the source of N as the Group V element. As dopants there may be used monosilane ($SiH_4$) or disilane ($Si_2H_6$) as the Si source and germanium ($GeH_4$) or an organic germanium compound as the Ge source for the n-type, and, for example, biscyclopentadienylmagnesium ($Cp_2Mg$) or bisethylcyclopentadienylmagnesium ($(EtCp)_2Mg$) as the Mg source for the p-type.

Using an electrode configuration for a semiconductor light emitting device according to the invention can yield a gallium nitride-based compound semiconductor light emitting device with high light emission intensity. In other words, since this technique allows fabrication of high-brightness LED lamps, the devices that incorporate chips fabricated by the technique, including electronic devices such as cellular phones, displays and panels, as well as automobiles, computers and games incorporating such electronic devices, can be driven with low power while exhibiting high characteristics. In particular, an effect of reduced power consumption is exhibited for battery-driven devices such as cellular phones, games, toys and automobile parts.

The light emitting device of the present invention may be subjected onto a submount, connected by wiring to a lead frame and sealed with resin to advantageously fabricate an LED lamp resembling a cannonball, which may be accomplished by use of the conventional methods.

Further, the light emitting device of the present invention can be combined with a fluorescent substance such as a YAG-based phosphor or silicate phosphor, using a conventional method, to provide an improved light emitting device in which the color of light is controlled.

EXAMPLES

FIG. 1 is a cross-sectional view of a gallium nitride-based compound semiconductor light emitting device fabricated as a working example.

The present invention will now be further explained by examples, with the understanding that the invention is in no way limited to these examples.

Example 1

A schematic view is shown in FIG. 1.

In Example 1, an epitaxial substrate was used having the laminated structure described below. Specifically, on a sapphire substrate there were laminated five layers: a ground layer composed of undoped GaN to a thickness of 6 μm, a Ge-doped n-type GaN contact layer to a thickness of 4 μm, an n-type Si-doped $In_{0.1}Ga_{0.9}N$ clad layer to a thickness of 180 nm, an Si-doped GaN barrier layer to a thickness of 16 nm and an $In_{0.2}Ga_{0.8}N$ well layer to a thickness of 2.5 nm, over a buffer layer made of AlN, and finally there were laminated in order a light emitting layer with a multiple quantum well structure provided with a barrier layer, an Mg-doped p-type $Al_{0.07}Ga_{0.93}N$ clad layer to a thickness of 0.01 μm and an Mg-doped p-type $Al_{0.02}Ga_{0.98}N$ contact layer to a thickness of 0.175 μm. On the p-type $Al_{0.02}Ga_{0.98}N$ contact layer there was formed a positive electrode (10) according to the invention comprising a light-permeable electrode (11) made of ITO to a thickness of 250 nm and a bonding pad electrode (12) with a 5-layer structure composed of a 50 nm Al layer, a 20 nm Ti layer, a 10 nm Al layer, a 100 nm Ti layer and a 200 nm Au layer.

Next, there were formed on the n-type GaN contact layer a transparent region (21) made of Al to a thickness of 5 nm and a bonding pad (22) with a Ti/Au bilayer structure, as a light emitting device with the light extraction side as the semiconductor side. The shapes of the positive electrode and negative electrode were as shown in FIG. 1.

In this construction, the n-type GaN contact layer carrier concentration was $7 \times 10^{19}$ cm$^{-3}$ and the p-type $Al_{0.02}Ga_{0.98}N$ contact layer carrier concentration was $5 \times 10^{18}$ cm$^{-3}$.

Lamination of the gallium nitride-based compound semiconductor layer was carried out by MOCVD, under ordinary known conditions in the field. The positive electrode and negative electrode were formed by the following procedure.

First, the portion of the n-type GaN contact layer on which the negative electrode was to be formed was exposed by reactive ion etching, according to the procedure described below.

An etching mask was formed on the p-type semiconductor layer first. The formation procedure was as follows. After applying the resist uniformly over the entire surface, a publicly known lithography technique was used to remove the resist from a region slightly larger than the positive electrode region. After setting in a vacuum vapor deposition apparatus, an ITO film was laminated to about 500 nm by the electron beam method, under a pressure of $4 \times 10^{-4}$ Pa. The metal film other than on the positive electrode region was then removed together with the resist by a lift-off technique.

Next, the semiconductor laminated substrate was placed on an electrode in the etching chamber of a reactive ion etching apparatus, the pressure in the etching chamber was reduced to $10^{-4}$ Pa, and then $Cl_2$ was supplied as etching gas for etching until the n-type GaN contact layer was exposed. After etching, the laminate was removed from the reactive ion etching apparatus and the etching mask was removed using nitric acid and hydrofluoric acid.

Next, after removal from the vacuum chamber, it was processed by an ordinary known "lift-off" procedure, after which a lowermost layer made of Pt, a barrier layer made of Ti, a barrier layer made of Al, a barrier layer made of Ti and an uppermost layer made of Au were laminated in that order by the same method on a portion of the current diffusion layer, to form a bonding pad electrode (12). Thus, a positive electrode according to the invention was formed on the p-type GaN contact layer.

Next, a negative electrode was formed on the exposed n-type GaN contact layer by the following procedure. After applying the resist uniformly over the entire surface, a publicly known lithography technique was used to remove the resist from the negative electrode-formed section of the exposed n-type GaN contact layer, and an Al thin-film with a thickness of 5 nm was formed by vacuum vapor deposition with a resist protecting the sections other than the region on which the transparent electrode was to be formed, after which a lift-off method was used to remove the Al film (21) from the sections other than those where it was to be formed. In addition, a negative side bonding pad (22) was formed comprising Ti at 100 nm and Au at 200 nm in that order from the semiconductor side, by an ordinary vacuum vapor deposition process. The resist was then removed by a publicly known process.

The wafer obtained by forming the positive electrode and negative electrode in this manner was subjected to grinding and polishing on the substrate back surface to reduce the thickness of the substrate to 80 µm, and then a laser scriber was used to draw scratch lines from the semiconductor laminate side and the wafer was broken into 350 µm-square chips. The chips were used for forward voltage measurement with a current application of 20 mA through a probe wire, yielding a value of 3.0 V.

Each chip was then mounted in a TO-18 can package for measurement of the light emission output using a tester, and a light emission output of 12.5 mW was exhibited with an applied current of 20 mA. It was confirmed that the luminescence distribution on the light-emitting side permitted luminescence on the entire surface under the positive electrode.

The reflectivity of the reflective layer fabricated for this example was 92% in a wavelength region of 470 nm. The value was measured with a spectrophotometer using a dummy glass substrate placed in the same chamber during formation of the bonding pad electrode.

Comparative Example 1

A light emitting device was fabricated in the same manner as Example 1, except that the n-electrode, although in the same region as in FIG. 1, was not light-permeable.

Upon evaluation of the obtained light emitting device in the same manner as Example 1, the forward voltage was 3.0 V as in Example 1 but the light emission output was 11 mW.

Example 2

A giant chip with 1 mm sides as shown in FIG. 2 was fabricated. The materials and construction of the electrodes were the same as in Example 1, but the pattern was changed.

Upon evaluation of the obtained light emitting device, a current of 350 mA resulted in a forward voltage of 3.2 V and a light emission output of 200 mW.

Comparative Example 2

A light emitting device was fabricated in the same manner as Example 2, except that the n-electrode, although in the same region as in FIG. 2, was not light-permeable.

Upon evaluation of the obtained light emitting device in the same manner as Example 2, the forward voltage was 3.2 V as in Example 1 but the light emission output was 150 mW.

In a device having a structure with the electrodes formed on the same side of the light emitting device, the problem of current spread can be solved if each electrode is an electrode comprising a bonding pad and a transparent electrode, and this can increase the light emission intensity without lowering the efficiency of emitted light extraction, even when the electrode structure is one that lowers the driving voltage by having an enlarged electrode contact area.

INDUSTRIAL APPLICABILITY

A semiconductor light emitting device produced with electrodes according to the invention has low driving voltage and high light emission intensity, and is therefore very useful as a material for lamps and the like.

The invention claimed is:

1. An electrode for a semiconductor light emitting device, wherein the semiconductor light emitting device has a structure with an n-type or p-type first electrode and an opposing second p-type or n-type electrode of opposite polarity on the same side of the light emitting device, wherein each of said first and second electrodes comprises a bonding pad formed on a transparent conductive layer; characterized by having a flat shape wherein the transparent conductive layer of the opposing second electrode surrounds all of the perimeter of the transparent conductive layer of the first electrode; and characterized in that a portion of the bonding pad of the opposing second electrode is formed on the transparent conductive layer of the second electrode while the remainder is formed on a semiconductor layer of the semiconductor light emitting device.

2. An electrode for a semiconductor light emitting device according to claim 1, characterized by having a flat shape in which the transparent conductive layer of the first electrode and the transparent conductive layer of the second electrode are alternately embedded.

3. An electrode for a semiconductor light emitting device according to claim 1, characterized in that the area of the transparent conductive layer of the n-type electrode is smaller than the area of the transparent conductive layer of the p-type electrode.

4. An electrode for a semiconductor light emitting device according to claim 1, characterized in that the material of the transparent conductive layer of the n-type electrode is at least one selected from the group consisting of ITO, aluminum oxide, zinc, fluorine-doped tin oxide, titanium oxide, zinc sulfide, bismuth oxide and magnesium oxide.

5. An electrode for a semiconductor light emitting device according to claim 4, characterized in that the thickness of the transparent conductive layer of the n-type electrode is 10-100 nm.

6. An electrode for a semiconductor light emitting device according to claim 1, characterized in that the material of the transparent conductive layer of the n-type electrode is at least one selected from the group consisting of aluminum, nickel, titanium, gold, silver and chromium.

7. An electrode for a semiconductor light emitting device according to claim 6, characterized in that the thickness of the transparent conductive layer of the n-type electrode is 1-100 nm.

8. An electrode for a semiconductor light emitting device according to claim 1, characterized in that the transparent conductive layer of the n-type electrode transmits at least 70% of the emitted light.

9. An electrode for a semiconductor light emitting device according to claim 1, characterized in that the area of the transparent conductive layer of the n-type electrode is 5-50% of the semiconductor layer of the semiconductor light emitting device.

10. An electrode for a semiconductor light emitting device according to claim 1, characterized in that the n-type electrode is constructed of said bonding pad and said transparent conductive layer that extends from said pad along the perimeter of the semiconductor layer of the semiconductor light emitting device.

11. An electrode for a semiconductor light emitting device according to claim 1, characterized in that the thickness of the transparent conductive layer of the p-type electrode is 5-1000 nm.

12. An electrode for a semiconductor light emitting device according to claim 1, characterized in that the bonding pad of the n-type electrode and the bonding pad of the p-type electrode are formed on opposite sides or corners of the light emitting device.

13. An electrode for a semiconductor light emitting device according to claim 1, characterized in that each of the bonding pads has a multilayer structure, of which a lowermost layer on a side of the bonding pad closest to its corresponding transparent conductive layer comprises a metal selected from the group consisting of Cr, Al, Ti, Pt, Rh, Ru, Ir and Ag.

14. An electrode for a semiconductor light emitting device according to claim 13, characterized in that each of the bonding pads has a multilayer structure, and a layer formed over the lowermost layer comprises a metal selected from the group consisting of Ti, Cr and Al.

15. An electrode for a semiconductor light emitting device according claim 1, characterized in that each of the bonding pads of the n-type and p-type electrodes has a multilayer structure, and an uppermost layer of each of the bonding pads comprises Au or Al.

16. An electrode for a semiconductor light emitting device according to claim 1, characterized in that the semiconductor layer of the semiconductor light emitting device has a size of 500 μm or greater.

17. An electrode for a semiconductor light emitting device according to claim 1, characterized in that the light emitting device is a GaN-based semiconductor light emitting device.

18. A light emitting device employing an electrode according claim 1.

19. A light emitting device obtained by combining a light emitting device according to claim 18 with a fluorescent material.

20. A lamp employing a light emitting device according to claim 18.

21. An electrode for a semiconductor light emitting device according to claim 1, wherein a portion of the bonding pad of the opposing second electrode is formed on the transparent conductive layer of the second electrode while the remainder is directly formed on a semiconductor layer of the semiconductor light emitting device.

* * * * *